United States Patent
Uemura et al.

(10) Patent No.: US 10,461,721 B2
(45) Date of Patent: Oct. 29, 2019

(54) SEMICONDUCTOR APPARATUS, DEGRADATION VALUE DETERMINATION SYSTEM AND PROCESSING SYSTEM

(71) Applicant: Renesas Electronics Corporation, Tokyo (JP)

(72) Inventors: Toshifumi Uemura, Tokyo (JP); Kazuki Fukuoka, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 171 days.

(21) Appl. No.: 15/349,036

(22) Filed: Nov. 11, 2016

(65) Prior Publication Data

US 2017/0141762 A1   May 18, 2017

(30) Foreign Application Priority Data

Nov. 12, 2015   (JP) .................................. 2015-221885

(51) Int. Cl.
*H03K 3/011* (2006.01)
*H01L 21/66* (2006.01)
(Continued)

(52) U.S. Cl.
CPC ......... *H03K 3/011* (2013.01); *G01R 31/2601* (2013.01); *G01R 31/2856* (2013.01);
(Continued)

(58) Field of Classification Search
CPC .................. G01R 31/2601; G01R 31/2884; H03K 3/011; H03K 3/0311; H03K 3/0315; H03L 7/00; H01L 22/34
(Continued)

(56) References Cited

U.S. PATENT DOCUMENTS

| 6,141,278 A | 10/2000 | Nagase |
| 7,385,383 B2 * | 6/2008 | Reddy .................. G01R 31/002 324/612 |

(Continued)

FOREIGN PATENT DOCUMENTS

| JP | 08-227598 A | 9/1996 |
| JP | 2013-88394 A | 5/2013 |
| WO | 2011/027553 A1 | 3/2011 |

OTHER PUBLICATIONS

Japanese Office Action issued in corresponding Japanese Patent Application No. 2015-221885, dated Feb. 19, 2019, with English Translation.
Japanese Notification of Reason for Refusal issued in corresponding Japanese Patent Application No. 2015-221885, dated Jun. 25, 2019, with English Translation.

*Primary Examiner* — Arnold M Kinkead
(74) *Attorney, Agent, or Firm* — McDermott Will & Emery LLP

(57) ABSTRACT

A semiconductor apparatus includes an operation oscillator, a reference oscillator, a first operation switch connected in series with the operation oscillator between a power supply potential VDD and a ground potential GND, a first reference switch connected in series with the reference oscillator between the power supply potential VDD and the ground potential GND, a second reference switch connected in parallel with the reference oscillator between the power supply potential VDD and the ground potential GND, an operation counter configured to count the number of output pulses from the operation oscillator in a measurement period, and a reference counter configured to count the number of output pulses from the reference oscillator in the measurement period.

14 Claims, 13 Drawing Sheets

(51) Int. Cl.
*H03L 7/00* (2006.01)
*G01R 31/26* (2014.01)
*G01R 31/28* (2006.01)
*H03K 3/03* (2006.01)

(52) U.S. Cl.
CPC ............ *H01L 22/34* (2013.01); *H03L 7/00* (2013.01); *H03K 3/0315* (2013.01)

(58) Field of Classification Search
USPC ............... 703/15; 324/612, 76.11; 331/57
See application file for complete search history.

(56) References Cited

U.S. PATENT DOCUMENTS

| | | |
|---|---|---|
| 8,212,576 B1 | 7/2012 | Cho et al. |
| 8,674,774 B2 * | 3/2014 | Saneyoshi .......... G01R 31/2856 331/55 |
| 9,157,959 B2 | 10/2015 | Ishimi |
| 2005/0134394 A1 | 6/2005 | Liu |
| 2008/0252329 A1 | 10/2008 | Muniandy et al. |
| 2014/0176116 A1 * | 6/2014 | Kumar ............... G01R 31/2858 324/76.41 |

\* cited by examiner

SEMICONDUCTOR APPARATUS, DEGRADATION VALUE DETERMINATION SYSTEM AND PROCESSING SYSTEM

CROSS-REFERENCE TO RELATED APPLICATIONS

This application is based upon and claims the benefit of priority from Japanese patent application No. 2015-221885, filed on Nov. 12, 2015, the disclosure of which is incorporated herein in its entirety by reference.

BACKGROUND

The present invention relates to a semiconductor apparatus, a degradation value determination system, and a processing system.

International Patent Publication No. WO2011/27553 (hereinafter referred to as "Patent Literature 1") discloses an aged-degradation diagnosis apparatus using ring oscillators. The apparatus disclosed in Patent Literature 1 includes a test ring oscillator, a reference ring oscillator, load means, comparison means, and control means. The test ring oscillator and the reference ring oscillator include logic gates having the same configuration as each other. The control means makes the test ring oscillator and the reference ring oscillator simultaneously oscillate by using a common control signal.

The load means supplies a load signal to the test ring oscillator and the reference ring oscillator. Specifically, the load means advances the degradation of the logic gates included in the test ring oscillator by applying a load signal to the test ring oscillator for a predetermined time period. In this state, the power supply terminal of the reference ring oscillator is connected to a GND and hence the reference ring oscillator is brought into a state under no stress (paragraph [0027]). As a result, the degradation of the logic gates included in the reference ring oscillator hardly advances.

After that, the control means simultaneously supplies a control signal to the reference ring oscillator and the test ring oscillator. Then, the comparison means compares the amount of the shift of pulses of the reference ring oscillator with that of the test ring oscillator. Specifically, a counter circuit counts pulses of the reference ring oscillator and those of the test ring oscillator. Then, the comparison means compares these count numbers with each other and thereby calculates the amounts of the shifts of pulses of the reference ring oscillator and the test ring oscillator.

Japanese Unexamined Patent Application Publication No. 2013-88394 (hereinafter referred to as "Patent Literature 2") discloses a semiconductor apparatus including a ring oscillator including multi-stage gate components, and a delay monitor that measures a delay of the ring oscillator. In the semiconductor apparatus disclosed in Patent Literature 2, a CPU (Central Processing Unit) controls a power supply voltage and an operating frequency according to the delay time measured by the delay monitor. Further, when the delay time exceeds a reference value, the CPU determines that an LSI (Large Scale Integration) has deteriorated over time and hence gives a warning.

Further, Patent Literature 2 discloses a configuration in which a pair of two delay monitors is used (FIG. 19). A ring oscillator of the first delay monitor continues oscillating except for predetermined cycles before and after a measurement period. Meanwhile, a ring oscillator of the second delay monitor oscillates only in the measurement period. Therefore, since the oscillating time of the ring oscillator of the first delay monitor is longer than the oscillating time of the ring oscillator of the second delay monitor, the ring oscillator of the first delay monitor deteriorates earlier than the ring oscillator of the second delay monitor. Further, when a difference between the delay times measured in the two delay monitors exceeds a reference value, the CPU determines that the LSI has deteriorated over time.

SUMMARY

However, there is a problem that since the voltage range and the temperature range are large, it is very difficult to accurately measure the level of the aged-degradation in real time. For example, in the apparatus disclosed in Patent Literature 1, the power supply configuration is regarded as an ideal power supply configuration. However, in reality, the apparatus is affected by a difference between power-source impedances and errors in potential between power supplies. That is, when a deviation occurs between the power supply voltages of the reference ring oscillator and test ring oscillator, an error occurs in a measurement result.

Further, even when the oscillation is stopped, a type of aged-degradation such as NBTI advances. Therefore, in the apparatus disclosed in Patent Literature 2, the ring oscillator of the second delay monitor deteriorates over time. Accordingly, it is very difficult to accurately measure the level of aged-degradation by using the technique like the one used in the apparatus disclosed in Patent Literature 2 in which a difference between delay times is compared with a reference value.

Other objects and novel features will be more apparent from the following description in the specification and the accompanying drawings.

According to one embodiment, a semiconductor apparatus includes: an operation oscillator; a reference oscillator; a first operation switch connected in series with the reference oscillator between a power supply potential and a ground potential; a first reference switch connected in series with the reference oscillator between the power supply potential and the ground potential; a second reference switch connected in parallel with the reference oscillator between the power supply potential and the ground potential; an operation counter configured to count the number of output pulses from the operation oscillator; and a reference counter configured to count the number of output pulses from the reference oscillator.

According to the above-described embodiment, it is possible to accurately measure the level of degradation (herein also referred to as a "degradation level" or a "degradation value").

BRIEF DESCRIPTION OF THE DRAWINGS

The above and other aspects, advantages and features will be more apparent from the following description of certain embodiments taken in conjunction with the accompanying drawings, in which.

DETAILED DESCRIPTION

Figure 1:
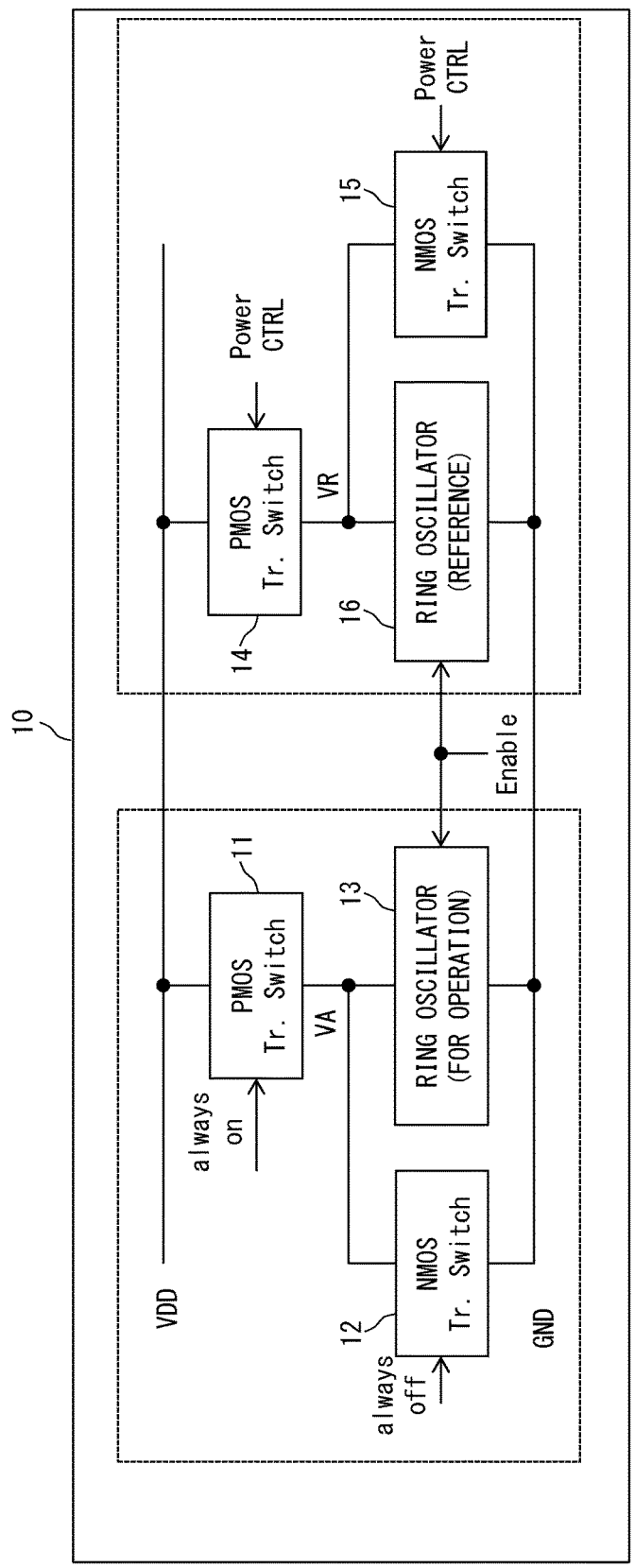
FIG. 1 shows a configuration of a semiconductor apparatus according to a first embodiment.

For clarifying the explanation, the following descriptions and the drawings may be partially omitted and simplified as appropriate. Further, each of the elements that are shown in the drawings as functional blocks for performing various processes can be implemented by hardware such as a CPU, a memory, and other types of circuits, or implemented by software such as a program loaded in a memory. Therefore, those skilled in the art will understand that these functional blocks can be implemented solely by hardware, solely by software, or a combination thereof. That is, they are limited to neither hardware nor software. Note that the same symbols are assigned to the same components throughout the drawings and duplicated explanations are omitted as required.

Further, the above-described program can be stored in various types of non-transitory computer readable media and thereby supplied to computers. The non-transitory computer readable media includes various types of tangible storage media. Examples of the non-transitory computer readable media include a magnetic recording medium (such as a flexible disk, a magnetic tape, and a hard disk drive), a magneto-optic recording medium (such as a magneto-optic disk), a CD-ROM (Read Only Memory), a CD-R, and a CD-R/W, and a semiconductor memory (such as a mask ROM, a PROM (Programmable ROM), an EPROM (Erasable PROM), a flash ROM, and a RAM (Random Access Memory)). Further, the program can be supplied to computers by using various types of transitory computer readable media. Examples of the transitory computer readable media include an electrical signal, an optical signal, and an electromagnetic wave. The transitory computer readable media can be used to supply programs to computer through a wire communication path such as an electrical wire and an optical fiber, or wireless communication path.

First Embodiment (Semiconductor Apparatus)

A configuration of a semiconductor apparatus according to this embodiment is explained with reference to FIG. 1. FIG. 1 is a block diagram showing a configuration of a semiconductor apparatus 10. The semiconductor apparatus 10 includes a first operation switch 11, a second operation switch 12, an operation ring oscillator 13, a first reference switch 14, a second reference switch 15, and a reference ring oscillator 16.

For example, the semiconductor apparatus 10 is provided in a sensor circuit (which is described later) in order to measure the level of the degradation over time (hereinafter also referred to as an "aged-degradation level") due to NBTI (Negative Bias Temperature Instability), PBTI (Positive Bias Temperature Instability), HCI (Hot Carrier Injection), and so on. The following explanation is based on the assumption that the semiconductor apparatus 10 measures the level of degradation by NBTI. The semiconductor apparatus 10 is mounted on a sensor circuit that measures the level of age-related degradation of an object to be measured (e.g., a macro block such as a processor core). The semiconductor apparatus 10 has a paired-oscillators configuration. That is, the semiconductor apparatus 10 measures a degradation level of the object to be measured by comparing the count numbers of pulses output from paired oscillators with each other.

The operation ring oscillator 13 and the first operation switch 11 are connected in series with each other between a power-supply potential VDD and a ground potential GND. Specifically, one end of the first operation switch 11 is connected to the power-supply potential VDD and the other end thereof is connected to the operation ring oscillator 13. Therefore, the operation ring oscillator 13 is disposed between the first operation switch 11 and the ground potential GND. A node between the first operation switch 11 and the operation ring oscillator 13 is referred to as a "node VA".

Further, the second operation switch 12 is connected in parallel with the operation ring oscillator 13. That is, one end of the second operation switch 12 is connected to the node VA and the other end thereof is connected to the ground potential GND.

Similarly, the reference ring oscillator 16 and the first reference switch 14 are connected in series with each other between the power-supply potential VDD and the ground potential GND. Specifically, one end of the first reference switch 14 is connected to the power-supply potential VDD and the other end thereof is connected to the reference ring oscillator 16. Therefore, the reference ring oscillator 16 is disposed between the first reference switch 14 and the ground potential GND. A node between the first reference switch 14 and the reference ring oscillator 16 is referred to as a "node VR".

Further, the second reference switch 15 is connected in parallel with the reference ring oscillator 16. That is, one end of the second reference switch 15 is connected to the node VR and the other end thereof is connected to the ground potential GND.

The first operation switch 11 and the first reference switch 14 are PMOS (Metal Oxide Semiconductor) transistor switches. The second operation switch 12 and the second reference switch 15 are NMOS transistor switches.

The operation ring oscillator 13 is equivalent to the reference ring oscillator 16. Specifically, both the operation ring oscillator 13 and the reference ring oscillator 16 have an equivalent configuration in which logic gates are connected in a ring configuration. The operation ring oscillator 13 includes the same number of logic gates as that of the reference ring oscillator 16. Further, the configuration of the logic gates of the operation ring oscillator 13 is identical to that of the reference ring oscillator 16.

The first operation switch 11 is in an on-state and the second operation switch 12 is in an off-state under normal conditions. Note that the power supply for the operation ring oscillator 13 is in an on-state under normal conditions. The operation ring oscillator 13 may be in an oscillating state or in an oscillation-stop state. However, the operating state of the operation ring oscillator 13 is preferably changed according to the operating state of an area where the sensor circuit is disposed (e.g., a CPU area). That is, the operation ring oscillator 13 is operated when a CPU is in operation and is stopped when the CPU is not in operation. In this way, it is possible to conform the operating time of the operation ring oscillator 13 to the operating time of the CPU, and thereby to reflect the aged-degradation level of the CPU in the aged-degradation level of the operation ring oscillator 13.

The first reference switch 14 and the second reference switch 15 are turned on/off according to a power supply control signal from a sensor control unit (not shown in FIG. 1). Specifically, when the degradation level is measured, the first reference switch 14 is turned on and the second reference switch 15 is turned off. Further, in the normal operating state in which the degradation level is not measured, the first reference switch 14 is turned off and the second reference switch 15 is turned on.

In this embodiment, the first reference switch 14 is disposed between the power-supply potential VDD and the reference ring oscillator 16 in order to prevent (or delay) the aged-degradation due to NBTI and the like. Therefore, by turning off the first reference switch 14 in the normal operating state, the power supply voltage is not supplied to the reference ring oscillator 16. In this way, it is possible to prevent the reference ring oscillator 16 from being aged-deteriorated in the normal operating state.

When an aged-degradation level is measured, the first reference switch 14 is turned on and the second reference switch 15 is turned off. Then, the operation ring oscillator 13 and the reference ring oscillator 16 are made to simultaneously oscillate. When the oscillations of the operation ring oscillator 13 and the reference ring oscillator 16 are stabilized, a pulse gate (which is described later) is brought into a through state (i.e., a not-gating state). After a predetermined measurement period has elapsed, the pulse gate is brought into a gating state. Pulses output from the operation ring oscillator 13 and those output from the reference ring oscillator 16 in the same period are counted and their count numbers are compared with each other. The aged-degradation level can be calculated by calculating a ratio between the count outputs of the operation ring oscillator 13 and the reference ring oscillator 16.

There is a possibility that when the first reference switch 14 is turned off, the potential at the node VR may get closer to the power-supply potential VDD because of the leak currents of the reference ring oscillator 16 and the first reference switch 14. Therefore, in order to bring the potential at the node VR closer to the ground potential GND, the second reference switch 15 is connected in parallel with the reference ring oscillator 16. The second reference switch 15 is turned on in the normal operating state. As a result, the potential at the node VR is lowered to the ground potential GND. Therefore, it is possible to prevent a voltage close to the power supply voltage from being applied to the reference ring oscillator 16. Consequently, it is possible to prevent the reference ring oscillator 16 from deteriorating in the normal operating state.

As described above, the operation ring oscillator 13 and the reference ring oscillator 16 are connected in parallel with each other between the power-supply potential VDD and the ground potential GND. That is, the operation ring oscillator 13 and the reference ring oscillator 16 use a common power supply. Further, the first operation switch 11 is disposed between the operation ring oscillator 13 and the power-supply potential VDD, and the first reference switch 14 is connected between the reference ring oscillator 16 and the power-supply potential VDD.

Further, the first operation switch 11 and the first reference switch 14 are preferably transistor switches similar to each other. In this way, it is possible to make changes in voltage of the first operation switch 11 and those in the first reference switch 14 coincide with each other. As a result, the degradation level can be accurately measured.

Note that the second operation switch 12 is not indispensable. However, to prevent occurrences of voltage variations due to a difference between the layout (i.e., the circuit pattern or the like) of the operation ring oscillator 13 and that of the reference ring oscillator 16, it is preferred that the second operation switch 12 uses transistor similar to that of the second reference switch 15.

Therefore, the operation ring oscillator 13 and the reference ring oscillator 16 operate at the same operating voltage at all times. As a result, it is possible to prevent or reduce measurement errors caused by variations in the power-supply voltage. Accordingly, the degradation level can be accurately measured even when the power-supply potential VDD or the ground potential GND fluctuates.

(Sensor Circuit)

Figure 2:
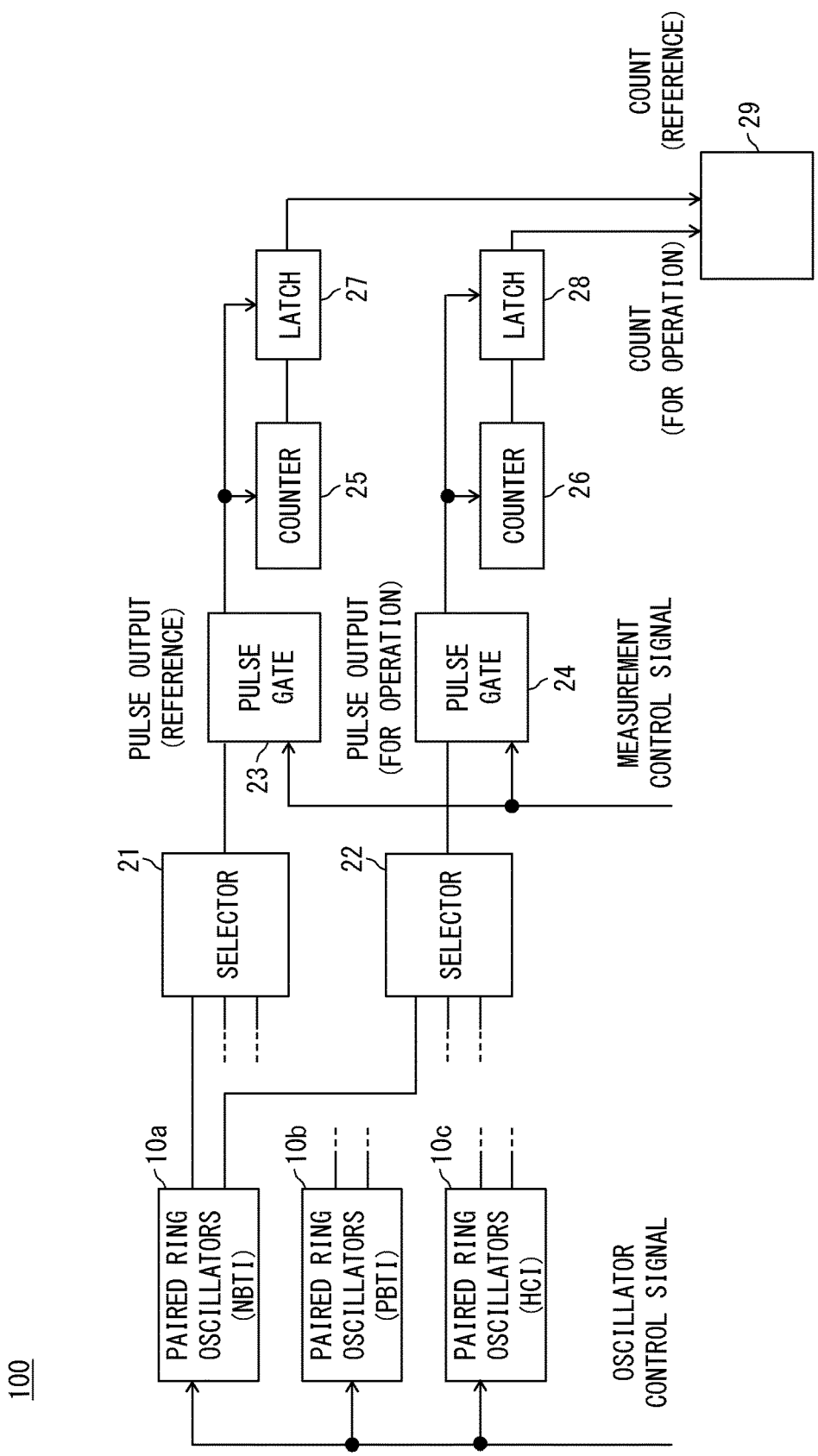
FIG. 2 shows a configuration of a sensor circuit using the semiconductor apparatus according to the first embodiment.

FIG. 2 is a block diagram showing a configuration of a sensor circuit 100 using the semiconductor apparatus 10. The sensor circuit 100 includes semiconductor apparatuses 10a to 10c, selectors 21 and 22, pulse gate components 23 and 24, counters 25 and 26, latch circuits 27 and 28, and a comparator 29. Note that the comparator 29 may be disposed outside the sensor circuit 100.

Each of the semiconductor apparatuses 10a to 10c is equivalent to the semiconductor apparatus 10 shown in FIG. 1 and configured to emphasize (i.e., to be dedicated to) a different degradation mode. For example, the operation ring oscillator 13 and the reference ring oscillator 16 of the semiconductor apparatus 10a have a gate configuration to emphasize NBTI (i.e., to cause NBTI more prominently). The operation ring oscillator 13 and the reference ring oscillator 16 of the semiconductor apparatus 10b have a gate configuration to emphasize PBTI. The semiconductor apparatus 10c has a gate configuration to emphasize HCI. As described above, a plurality of semiconductor apparatuses 10 are configured so that their ring oscillators emphasize (i.e., are dedicated to) different degradation modes.

Each of the semiconductor apparatuses 10a to 10c outputs pulses from its operation ring oscillator 13 and the reference ring oscillator 16. Each of the semiconductor apparatuses 10a to 10c changes its operation state between a normal operation state and a measurement operation state according to an oscillator control signal. In the measurement operation, the first reference switch 14 is turned on and the second reference switch 15 is turned off as described above.

Each of the selectors 21 and 22 selects one of the outputs from the semiconductor apparatuses 10a to 10c and outputs the selected output. Specifically, the selector 22 receives output pulses from the operation ring oscillators 13 of the semiconductor apparatuses 10a to 10c. Further, the selector 21 receives output pulses from the reference ring oscillators 16 of the semiconductor apparatuses 10a to 10c. The selectors 21 and 22 select outputs from the semiconductor apparatuses 10a to 10c according to the degradation mode to be measured.

When the degradation level by NBTI is measured, the selectors 21 and 22 select output pulses from the semiconductor apparatus 10a and output the selected output pulses to the pulse gate components 23 and 24, respectively. That is, when the degradation level by NBTI is measured, output pulses from the operation ring oscillator 13 of the semiconductor apparatus 10a is input to the pulse gate components 24 and output pulses from the reference ring oscillator 16 of the semiconductor apparatus 10a are input to the pulse gate component 23.

When the degradation level by PBTI is measured, the selectors 21 and 22 select output pulses from the semiconductor apparatus 10b and output the selected output pulses to the pulse gate components 23 and 24, respectively. That is, output pulses from the operation ring oscillator 13 of the semiconductor apparatus 10b is input to the pulse gate components 24 and output pulses from the reference ring oscillator 16 of the semiconductor apparatus 10b are input to the pulse gate component 23.

When the degradation level by HCI is measured, the selectors 21 and 22 select output pulses from the semiconductor apparatus 10c and output the selected output pulses to the pulse gate components 23 and 24, respectively. That is, output pulses from the operation ring oscillator 13 of the semiconductor apparatus 10c is input to the pulse gate components 23 and output pulses from the reference ring oscillator 16 of the semiconductor apparatus 10c are input to the pulse gate component 24. As described above, the selectors 21 and 22 select outputs from a plurality of semiconductor apparatuses 10 and output the selected outputs to the pulse gate components 23 and 24, respectively.

The pulses from the operation ring oscillator 13 and the reference ring oscillator 16 are input to the pulse gate components 23 and 24, respectively. Further, a measurement control signal is input to the pulse gate components 23 and 24. The pulse gate components 23 and 24 perform gating control for pulses according to the measurement control signal. Therefore, the pulse gate components 23 and 24 output the output pulses that are output during a measurement period to the counters 25 and 26, respectively. An adjustment is made so that the measurement periods of the pulse gate components 23 and 24 are equal to each other.

The output pulses that have passed through the pulse gate components 23 and 24 are input to the counters 25 and 26, respectively. The counter 25 counts output pulses that have passed through the pulse gate component 23. That is, the counter 25 counts the number of pulses output from the selector 21 during the measurement period. The counter 26 counts output pulses that have passed through the pulse gate component 24. That is, the counter 26 counts the number of pulses output from the selector 22 during the measurement period. Therefore, the counter 25 counts the output pulses from the reference ring oscillator 16 and the counter 26 counts the output pulses from the operation ring oscillator 13.

Note that the count numbers obtained by the counters 25 and 26 are written in the latch circuits 27 and 28, respectively. The latch circuit 27 stores the count number of the output pulses from the reference ring oscillator 16 and the latch circuit 28 stores the count number of the output pulses from the operation ring oscillator 13. The latch circuits 27 and 28 output the count numbers to the comparator 29.

The comparator 29 compares the count values from the latch circuits 27 and 28 with each other. That is, the comparator 29 compares the count value of the pulses output from the operation ring oscillator 13 during the measurement period with the count value of the pulses output from the reference ring oscillator 16 during the measurement period. If the operation ring oscillator 13 has considerably deteriorated compared to the reference ring oscillator 16, their count values considerably differ from each other. On the other hand, when the degradation level of the operation ring oscillator 13 is the same as that of the reference ring oscillator 16, their count values are equal to each other. Therefore, the degradation level can be measured by comparing the count values by the comparator 29. That is, the degradation level can be measured based on the comparison result in the comparator 29. Specifically, a ratio between the count values of the counters 25 and 26 or a difference therebetween can be converted into a degradation level. In this way, the degradation level can be accurately measured.

Note that although the count values are stored in the latch circuits 27 and 28 in the above example, it is also possible to adopt a configuration in which the count values are directly output from the counters 25 and 26 to the comparator 29.

Note that there is no particular limitation on the number of semiconductor apparatuses 10 provided in the sensor circuit 100. For example, two or more semiconductor apparatuses 10 may be provided in the sensor circuit 100. Alternatively, only one semiconductor apparatus 10 may be provided in the sensor circuit 100. In this case, the selectors 21 and 22, which will be described later, are unnecessary.

In this embodiment, output pluses are gated (i.e., subjected gating control) in the pulse gate components 23 and 24 only during a predetermined measurement period. By doing so, it is possible to prevent a deviation between the measurement period in the operation ring oscillator 13 and the measurement period in the reference ring oscillator 16. For example, a deviation between the measurement periods of the operation ring oscillator 13 and the reference ring oscillator 16 could occur when an oscillator control signal is generated due to environmental variations or the like. However, by performing measurement control by the pulse gate components 23 and 24 as in the case of this embodiment, it is possible to make the measurement periods of the operation ring oscillator 13 and the reference ring oscillator 16 coincide with each other. Therefore, the degradation level of the object to be measured can be measured more accurately.

(Processing System)

Figure 3:
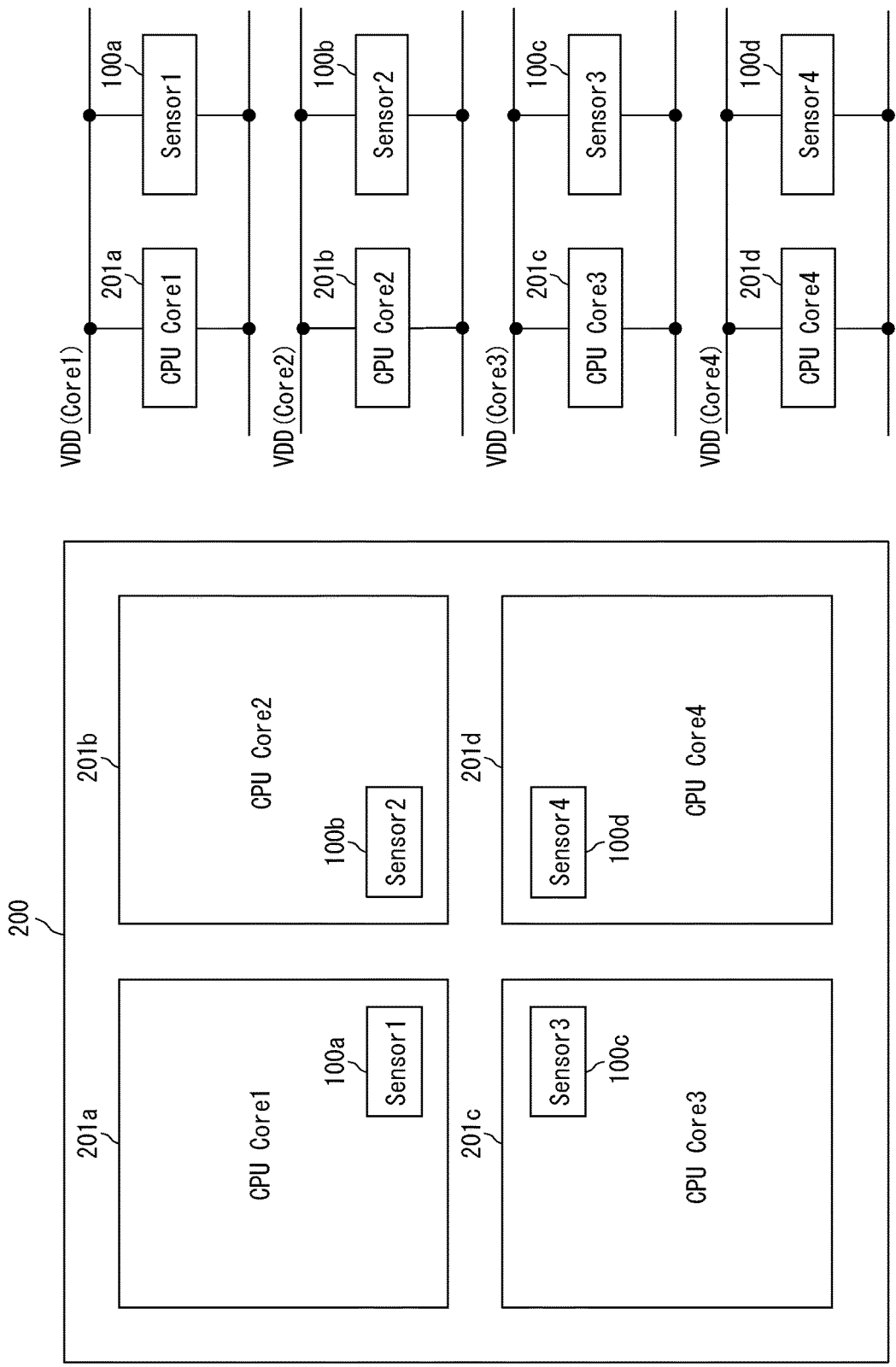
FIG. 3 shows a configuration of a processor system using the semiconductor apparatus according to the first embodiment.

FIG. 3 is a block diagram schematically showing a configuration of a processing system 200 including the sensor circuit 100 shown in FIG. 2 installed therein. FIG. 3 shows an example in which sensor circuits 100 are disposed in a CPU area. That is, each of the processor cores 201 is a CPU. Needless to say, each of the processor cores 201 is not limited to the CPU and may be a GPU (Graphics Processing Unit) or the like.

The processing system 200 is a processor system including a plurality of processor cores 201. Further, the processing system 200 includes a plurality of sensor circuits 100. Note that in FIG. 3, the four processor cores 201 disposed in the processing system 200 are referred to as "processor cores 201a to 201d". Each of the processor cores 201a to 201d is a macro block and they perform parallel arithmetic processing.

Further, the sensor circuits 100 are provided so that they correspond to the four processor cores 201a to 201d. In this example, the four sensor circuits 100 corresponding to the four processor cores 201a to 201d are referred to as "sensor circuits 100a to 100d". Note that the number of processor cores 201 and the number of sensor circuits 100 are not limited to four. That is, the processing system 200 should include at least two processor cores 201 and at least two sensor circuits 100.

In particular, the sensor circuit 100a corresponds to the processor core 201a and the sensor circuit 100b corresponds to the processor core 201b. Similarly, the sensor circuit 100c corresponds to the processor core 201c and the sensor circuit 100d corresponds to the processor core 201d.

The sensor circuit 100a measures the aged-degradation level of the processor core 201a and the sensor circuit 100b measures the aged-degradation level of the processor core 201b. The sensor circuit 100c measures the aged-degradation level of the processor core 201c and the sensor circuit 100d measures the aged-degradation level of the processor core 201d.

A common power supply voltage is supplied to both of the processor core 201a and the sensor circuit 100a. A common power supply voltage is supplied to both of the processor core 201b and the sensor circuit 100b. A common power supply voltage is supplied to both of the processor core 201c and the sensor circuit 100c. A common power supply voltage is supplied to both of the processor core 201d and the sensor circuit 100d.

As described above, a common power source is connected to each sensor circuit 100 and its corresponding processor core 201. By doing so, it is possible to detect aged-degradation of each processor core 201 that is changed according to the variations of its power source. That is, by supplying the sensor circuit 100 with electric power supply from the same power source as that for the object to be measured, the degradation of the operation ring oscillator 13 advances in such a manner that variations in the power source to the processor core 201 is taken into account in (i.e., affect) the degradation of the operation ring oscillator 13. Therefore, the degradation level can be accurately measured for each of the plurality of processor cores 201. This makes possible to correct the operating voltage of the processor core 201 and/or to give an alarm according to the measured degradation level.

Modified Example 1

Figure 4:
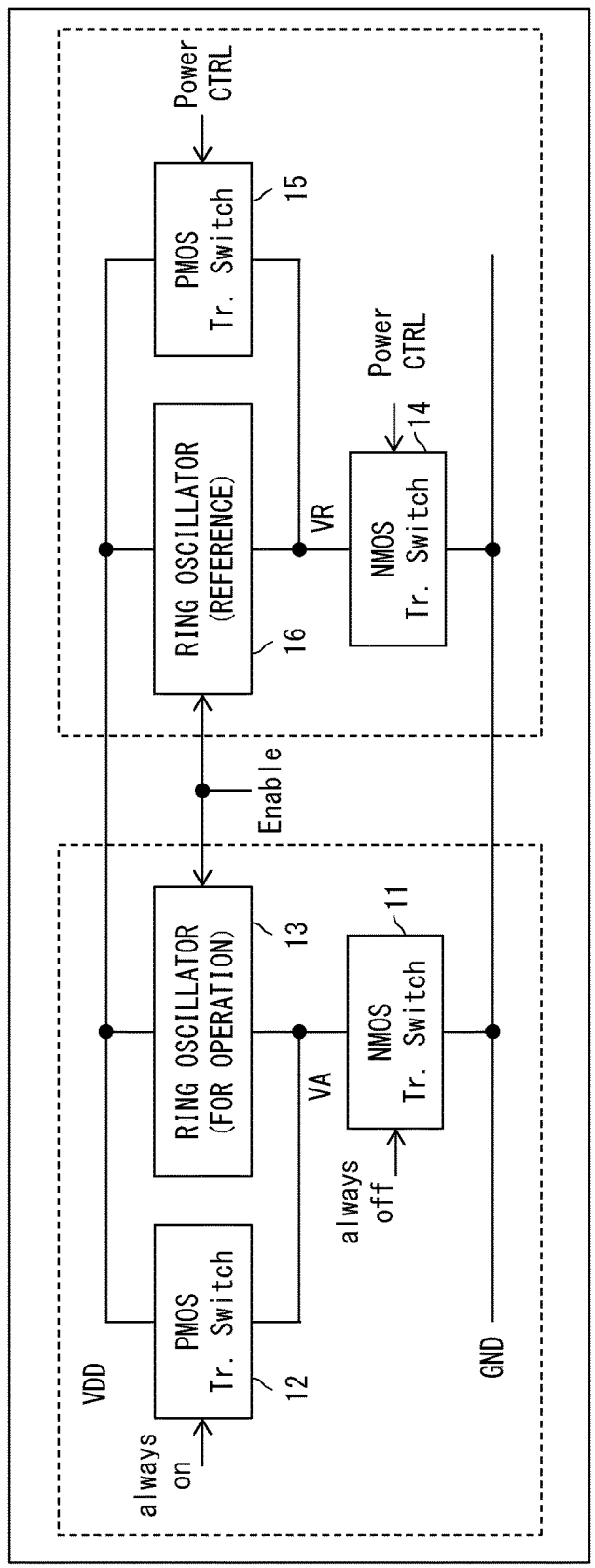
FIG. 4 shows a configuration of a semiconductor apparatus according to a first modified example.

A semiconductor apparatus 10 according to a modified example 1 of the first embodiment is explained with reference to FIG. 4. FIG. 4 shows a configuration of a semiconductor apparatus 10 according to the modified example 1. Similarly to FIG. 1, the semiconductor apparatus 10 according to the modified example 1 includes a first operation switch 11, a second operation switch 12, an operation ring oscillator 13, a first reference switch 14, a second reference switch 15, and a reference ring oscillator 16.

Similarly to FIG. 1, the operation ring oscillator 13 and the first operation switch 11 are connected in series with each other between a power-supply potential VDD and a ground potential GND. Further, the first reference switch 14 and the reference ring oscillator 16 are connected in series with each other between the power-supply potential VDD and the ground potential GND. The second operation switch 12 is connected in parallel with the operation ring oscillator 13, and the second reference switch 15 is connected in parallel with the reference ring oscillator 16.

The first embodiment has a configuration in which the power supply side of the reference ring oscillator 16 is separated and the node VR is pulled down to the ground side in the normal operating state. In contrast to this, the modified example 1 has a configuration in which the ground side of the reference ring oscillator 16 is separated and the node VR is pulled up to the power supply side.

Therefore, in the modified example 1, the second operation switch 12 and the second reference switch 15 are PMOS transistor switches, and the first operation switch 11 and the first reference switch 14 are NMOS transistor switches. Accordingly, the operation ring oscillator 13 is disposed on the power-supply potential VDD side of the first operation switch 11. Further, the reference ring oscillator 16 is connected on the power-supply potential VDD side of the second reference switch 15.

Each of the switches operates in a manner similar described above. That is, the first operation switch 11 is in an on-state and the second operation switch 12 is in an off-state under normal conditions. Similarly to the above explanation, when the degradation level is measured, the first operation switch 11 and the first reference switch 14 are turned on and the second operation switch 12 and the second reference switch 15 are turned off. As a result, a power supply voltage is applied to the operation ring oscillator 13 and the reference ring oscillator 16 and hence they oscillate.

The first reference switch 14 is turned off and the second reference switch 15 is turned on in the normal operating state. Therefore, the degradation of the reference ring oscillator 16 is prevented in the non-measurement state as described above. The level of degradation can be accurately measured by comparing the number of output pulses from the operation ring oscillator 13 with the number of output pulses from the reference ring oscillator 16.

The semiconductor apparatus 10 according to the modified example 1 can be used in the sensor circuit 100 shown in FIG. 2 and in the processing system 200 shown in FIG. 3. By doing so, advantageous effects similar to the above-described advantageous effects can be achieved.

Second Embodiment

Figure 5:
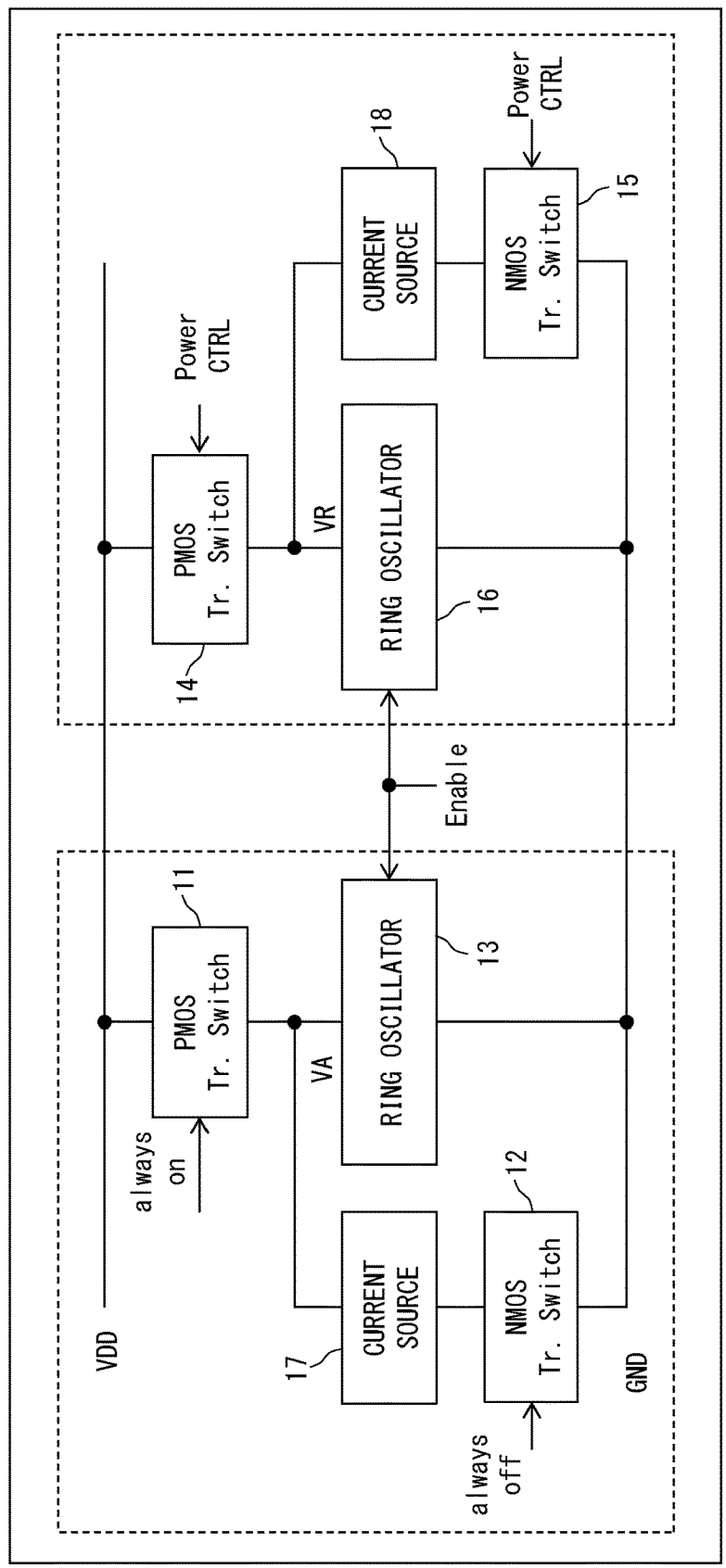
FIG. 5 shows a configuration of a semiconductor apparatus according to a second embodiment.

A semiconductor apparatus 10 according to a second embodiment is explained with reference to FIG. 5. Compared to the semiconductor apparatus 10 shown in FIG. 1, an operation current source 17 and a reference current source 18 are added in the semiconductor apparatus 10 shown in FIG. 5. Note that the configuration other than the operation current source 17 and the reference current source 18 of the second embodiment is similar to that of the first embodiment and therefore its explanation is omitted.

In this embodiment, the second operation switch 12 and the operation current source 17 are connected in series with each other between the node VA and the ground potential GND. Similarly, the second reference switch 15 and the reference current source 18 are connected in series with each other between the node VR and the ground potential GND. In this way, the current values can be controlled and hence the degradation level can be measured more accurately.

Modified Example 2

Figure 6:
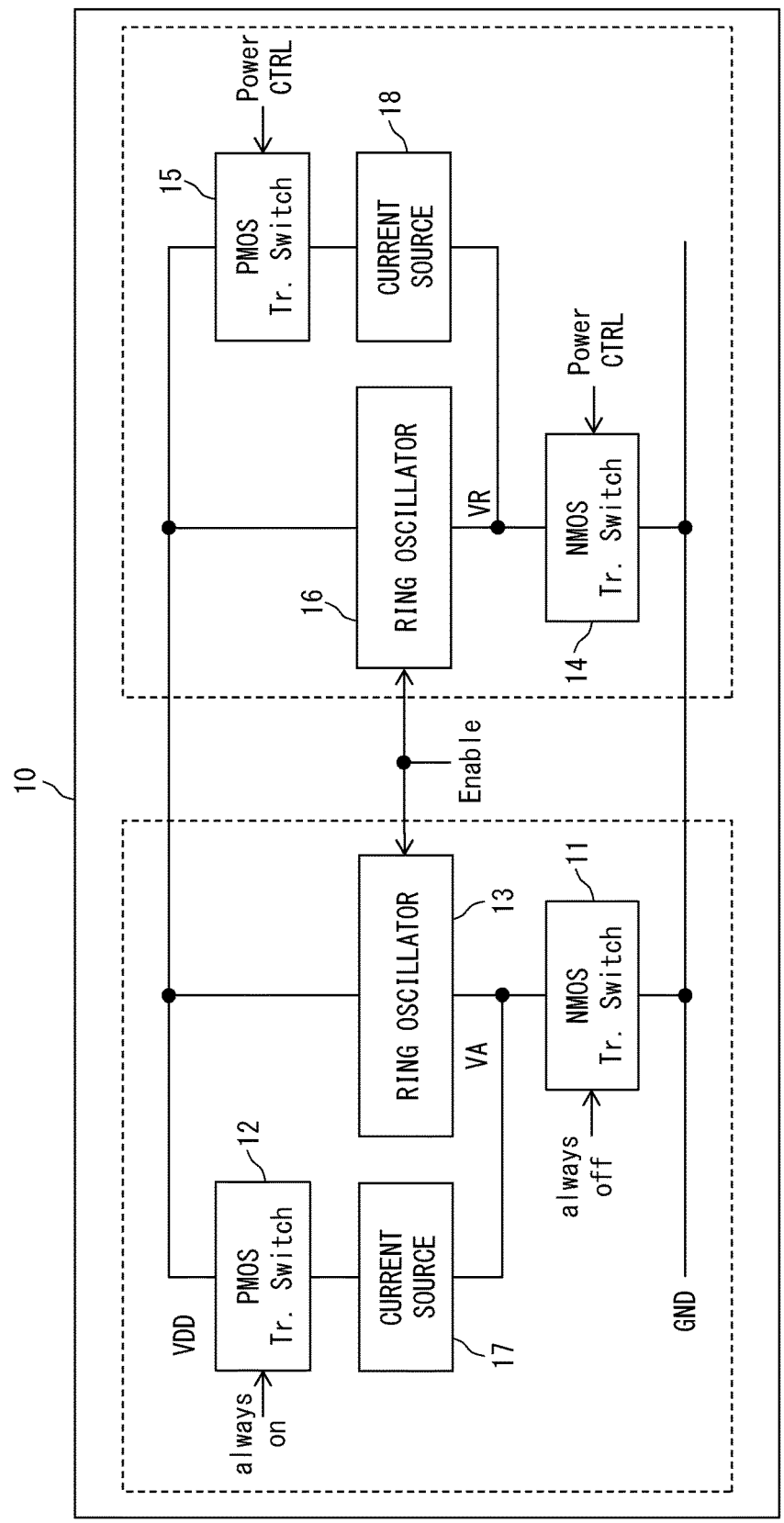
FIG. 6 shows a configuration of a semiconductor apparatus according to a modified example 2.

A semiconductor apparatus 10 according to a modified example 2 is explained with reference to FIG. 6. Compared to the semiconductor apparatus 10 shown in FIG. 4, an operation current source 17 and a reference current source 18 are added in the semiconductor apparatus 10 shown in FIG. 6. To explain the modified example 2 differently, FIG. 6 shows a configuration that is obtained by replacing the NMOS transistors with PMOS transistors and replacing the PMOS transistors with NMOS transistors in the semiconductor apparatus 10 shown in FIG. 5. Note that the configuration other than the operation current source 17 and the reference current source 18 of the modified example 2 is similar to that of the modified example 1 and therefore its explanation is omitted.

In the modified example 2, the second operation switch 12 and the operation current source 17 are connected in series with each other between the node VA and the power-supply potential VDD. Similarly, the second reference switch 15 and the reference current source 18 are connected in series with each other between the node VR and the power-supply potential VDD. In this way, the current values can be controlled and hence the degradation level can be measured more accurately.

Third Embodiment

Figure 7:
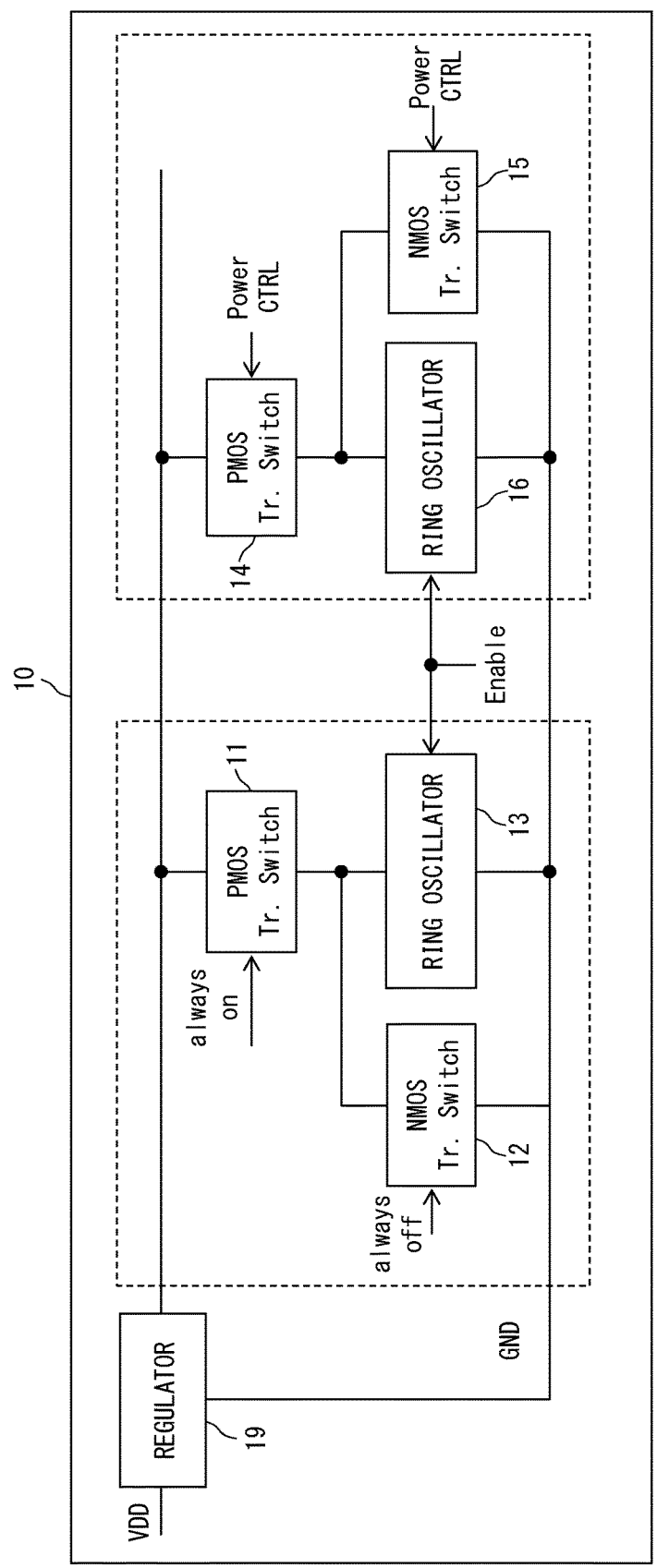
FIG. 7 shows a configuration of a semiconductor apparatus according to a third embodiment.

A semiconductor apparatus 10 according to this embodiment is explained with reference to FIG. 7. FIG. 7 shows a configuration of the semiconductor apparatus 10 according to the third embodiment. The configuration of the semiconductor apparatus 10 shown in FIG. 7 is obtained by adding a regulator 19 in the semiconductor apparatus 10 shown in FIG. 1. Note that the configuration other than the regulator 19 of the third embodiment is similar to that of the first embodiment and therefore its explanation is omitted.

In this embodiment, the regulator 19 is provided to stabilize the power supply voltage. Therefore, variations in the oscillator power supply are reduced when measurement is carried out, and hence errors in the measurement can be reduced. Consequently, the degradation level can be measured more accurately. Note that the regulator 19 can also be added in the configuration of the semiconductor apparatus 10 shown in the modified example 1, that in the second embodiment, and that in the modified example 2.

Fourth Embodiment

Figure 8:
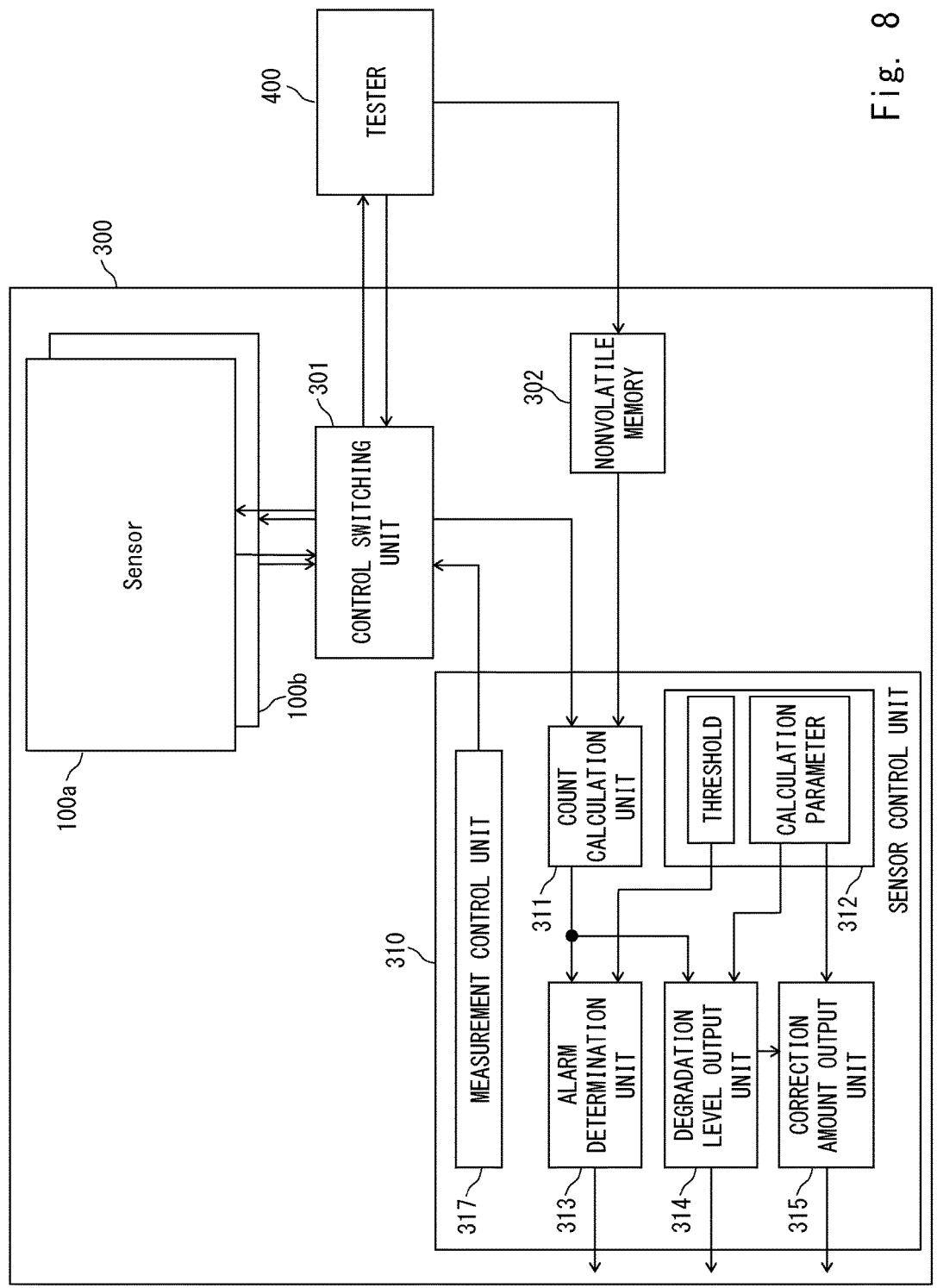
FIG. 8 shows a configuration of a degradation value determination system according to a fourth embodiment.

A degradation value determination system 300 according to a fourth embodiment is explained with reference to FIG. 8. FIG. 8 is a block diagram showing a configuration of the degradation value determination system 300. The degradation value determination system 300 according to this embodiment outputs an alarm or calculates a degradation level according to a count value or a difference value.

The degradation value determination system 300 includes sensor circuits 100*a* and 100*b*, a sensor control unit 310, a control switching unit 301, and a nonvolatile memory 302. Further, the degradation value determination system 300 is connected to a tester 400.

Each of the sensor circuits 100*a* and 100*b* is identical to the sensor circuit 100 shown in FIG. 2. The configuration of a semiconductor apparatus 10 used for the sensor circuits 100*a* and 100*b* is not limited to the configuration shown in FIG. 1. That is, the configurations shown in FIGS. 4 to 7 can also be used.

The sensor control unit 310 is a controller for controlling the sensor circuits 100*a* and 100*b*. The control switching unit 301 switches the control of the sensor circuits 100*a* and 100*b*, which are disposed in a plurality of places. Specifically, the control switching unit 301 performs switching as to whether the tester 400 directly controls the sensor circuits 100*a* and 100*b* or the sensor control unit 310 controls the sensor circuits 100*a* and 100*b*. Further, the control switching unit 301 selects the sensor circuits 100*a* and 100*b* one by one as the sensor circuit that measures a degradation level.

It is very difficult to completely eliminate variations in the manufacturing process between the operation ring oscillator 13 and the reference ring oscillator 16. Specifically, the difference between the operation ring oscillator 13 and the reference ring oscillator 16 is ideally zero when they have not deteriorated at all. However, because of the variations in the manufacturing process, the actual difference is not zero. Therefore, the nonvolatile memory 302 stores count values of the counters 25 and 26, or a difference between them (hereinafter, they are collectively referred to as a "measurement value"). By doing so, the influence of the variations in the manufacturing process can be reduced. For example, the nonvolatile memory 302 stores a measurement value obtained in measurement carried out under the control of the tester 400 as an initial value. The initial value indicates a value in an early stage of the operation in which the object to be measured has not deteriorated. By measuring the initial value in advance, errors in the difference value caused by variations in the manufacturing process can be corrected. The nonvolatile memory 302 includes, for example, a fuse and/or a flash memory.

The sensor control unit 310 includes a count calculation unit 311, a storage unit 312, an alarm determination unit 313, a degradation level output unit 314, a correction amount output unit 315, and a measurement control unit 317. A measurement value is input to the count calculation unit 311. Further, an initial value stored in the nonvolatile memory 302 is input to the count calculation unit 311. The count calculation unit 311 corrects the measurement value based on the initial value. For example, a value equivalent to the actual degradation level can be obtained by comparing a measurement value obtained after the degradation has advanced with the initial value by the count calculation unit 311. The count calculation unit 311 outputs the measurement value, which has been corrected by using the initial value, as a corrected value.

The corrected value output from the count calculation unit 311 is input to the alarm determination unit 313 and the degradation level output unit 314. The storage unit 312 includes a register or the like and thereby stores a threshold and a calculation parameter. The calculation parameter includes a parameter for converting the corrected value into a degradation level. Further, the calculation parameter includes a parameter for converting the degradation level or the corrected value into a voltage correction amount.

The alarm determination unit 313 reads the threshold from the storage unit 312 and compares the corrected value with the threshold. The alarm determination unit 313 outputs an alarm according to the result of the comparison between the corrected value and the threshold. Specifically, the alarm determination unit 313 outputs an alarm indicating that the aged-degradation has advanced to a certain level when the corrected value exceeds the threshold. When the alarm is output, the operation of the object to be measured (e.g., a macro block such as a processor core) may be stopped.

The degradation level output unit 314 reads a calculation parameter from the storage unit 312. Then, the degradation level output unit 314 converts the corrected value into a degradation level by using the calculation parameter. The degradation level output unit 314 outputs the calculated degradation level to an external device or the like and to the correction amount output unit 315.

The correction amount output unit 315 reads a calculation parameter stored in the storage unit 312. Then, the correction amount output unit 315 converts the degradation level into a voltage correction amount by using the calculation parameter. Then, the correction amount output unit 315 outputs the voltage correction amount to a system controller (not shown). The system controller corrects (i.e., changes) the operating voltage of the object to be measured according to the voltage correction amount. As a result, an appropriate operating voltage can be applied to the object to be measured. Therefore, it is possible to increase the life span of the object to be measured and reduce the power consumption.

The count value output from the sensor circuit 100 is a digital value. Therefore, the processes performed in the alarm determination unit 313, the degradation level output unit 314, and the correction amount output unit 315 can be easily performed. For example, by storing a calculation parameter used in a conversion formula for converting a corrected value into a degradation level in the storage unit 312 in advance, the degradation level can be easily calculated. Further, by storing a calculation parameter used in a conversion formula for converting a degradation level into a voltage correction amount in the storage unit 312, the voltage correction amount can be easily calculated. Needless to say, the degradation level may be directly calculated from the measurement value. Further, the voltage correction amount may be directly calculated from the measurement value or the corrected value.

The measurement control unit 317 controls measurement performed by the sensor circuit 100. The measurement control unit 317 has a function of performing oscillation enabling control of the sensor circuit 100 according to the load state of the object to be measured and/or the sensor circuit 100, a function of performing power supply control when measurement is carried out, and a function of performing control of a measurement period. Specifically, the measurement control unit 317 outputs an enabling signal and a power supply control signal shown in FIG. 1. Further, the measurement control unit 317 outputs a measurement control signal for controlling the gating periods of the pulse gate components 23 and 24 shown in FIG. 2. Further, the measurement control unit 317 outputs an oscillator control signal for switching between a normal operation and a measurement operation. In this way, the operation of the sensor circuit 100 can be switched between the normal operation and the measurement operation. Further, the measurement control unit 317 can change the sensor circuit 100 that measures a degradation level. For example, the measurement control unit 317 instructs the control switching unit 301 to perform switching control so that a plurality of sensor circuits 100a and 100b take their turns to measure degradation levels.

As described above, the degradation level output unit 314 performs digital processing for the measurement value and the correction information stored in the nonvolatile memory 302, and thereby calculates a digital value equivalent to the actual degradation level. Further, an alarm indicating that the aged-degradation has advanced to a certain level can be output by comparing the corrected value or the degradation level with the threshold. Further, by using the degradation level stored in the storage unit 312, the degradation level can be converted into the voltage correction amount. The sensor control unit 310 can externally output the digital code representing the degradation level and/or the voltage correction amount. Note that the calculation processing in the sensor control unit 310 may be performed by either software processing or hardware processing. Alternatively, the calculation processing may be performed by a combination of software processing and hardware processing.

By adding the sensor control unit 310 in the sensor circuit 100 as described above, a degradation level in the actual operating state can be measured. Further, system control can be performed according to the degradation level. Therefore, it is possible to prevent a sudden system stop. Further, it is possible to increase the life span of the system and exploit the full potential of the system performance.

Fifth Embodiment

Figure 9:
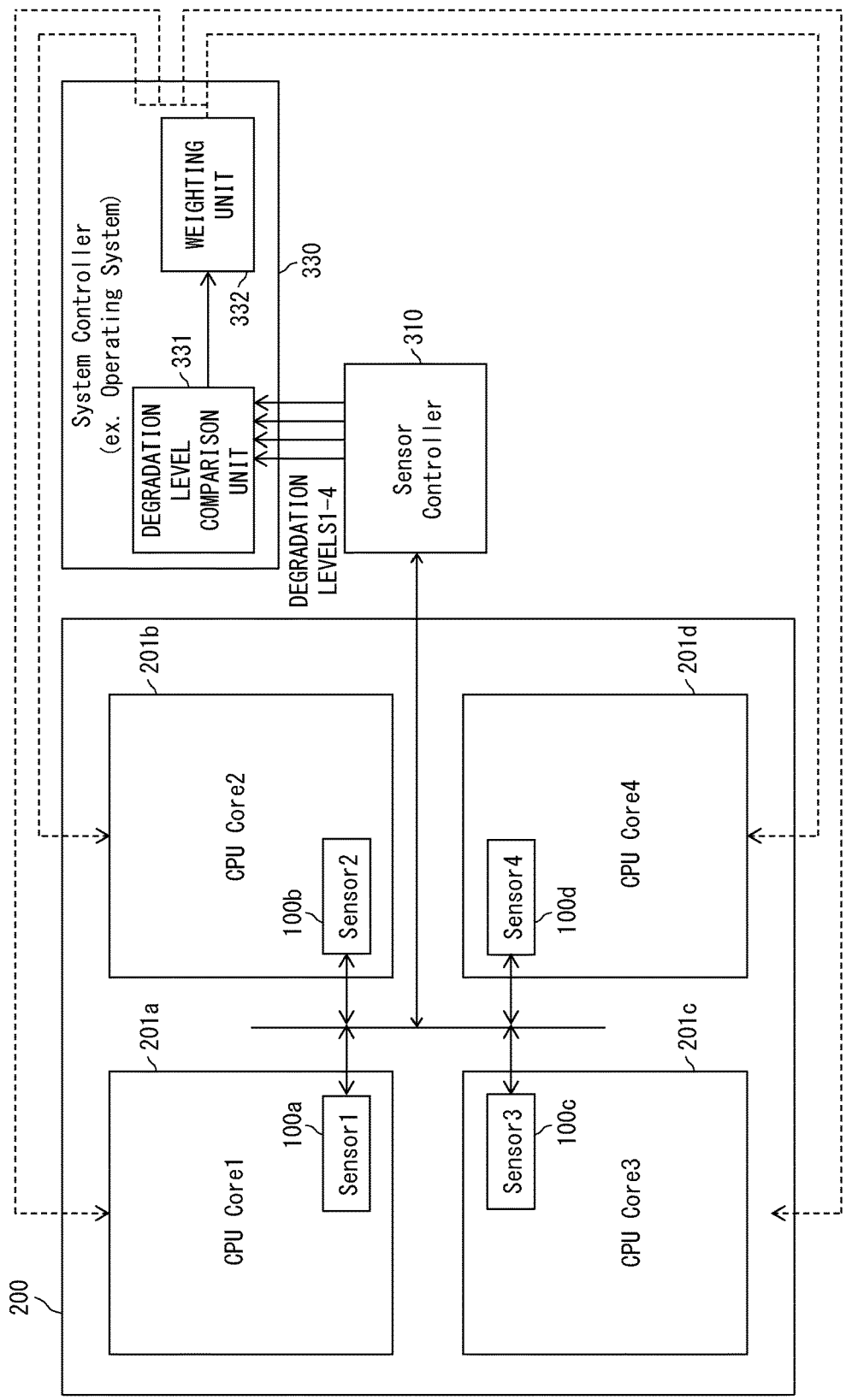
FIG. 9 shows a configuration of a processing system according to a fifth embodiment.

A processing system 200 according to this embodiment is explained with reference to FIG. 9. Compared to the processing system 200 shown in FIG. 3, a system controller 330 and a sensor control unit 310 are added in the processing system 200 according to the fifth embodiment. For the sensor control unit 310, the sensor control unit in the fourth embodiment can be used. Note that the explanation of parts of the configuration similar to those of the above-described first to fourth embodiments are omitted as appropriate.

Similar to the fourth embodiment, the processing system 200 includes sensor circuits 101a to 101d corresponding to processor cores 201a to 201d, respectively. Each of the sensor circuits 101a to 101d outputs a measurement value according to the degradation level of a respective one of the processor cores 201a to 201d to the sensor control unit 310. As described above, the sensor control unit 310 calculates the degradation level based on the measurement value. In this way, the degradation levels of the processor cores 201a to 201d are individually obtained. In FIG. 9, the degradation levels of the processor cores 201a to 201d are expressed as degradation levels 1 to 4, respectively.

The degradation levels 1 to 4 of the processor cores 201a to 201d are input to the system controller 330. The system controller 330 includes an OS (Operating System) and the like installed therein. The system controller 330 includes a degradation level comparison unit 331 and a weighting unit 332. The degradation level comparison unit 331 compares the degradation levels 1 to 4 with one another and outputs the result of the comparison to the weighting unit 332. The weighting unit 332 assigns weights to the processor cores 201a to 201d to be used.

Specifically, the weighting unit 332 assigns weights so that the larger the degradation level of a processor 201 is, the less likely that processor 201 will be used. That is, as the weighting unit 332 assigns weights, the amount of processing performed by a processor 201 having a large degradation level will increase and the amount of processing performed by a processor 201 having a small degradation level will decrease. As described above, the weighting unit 332 assigns weights to the processor cores 201 to be used based on the degradation levels 1 to 4.

Further, the system controller 330 assigns tasks to the processor cores 201 based on the result of the weighting. That is, the system controller 330 performs a process for assigning tasks to the processor cores 201 by software. By doing so, the smaller the degradation level of a processor core 201 is, the more tasks that processor core 201 is assigned.

By doing so, the imbalance among the degradation levels of the plurality of processor cores 201 can be reduced. As a result, the life span of the processing system 200 can be increased. That is, it is possible to prevent a certain processor core 201 from deteriorating much more rapidly than other processor cores 201. Further, by measuring degradation levels at regular intervals, the variations among the aged-degradation levels of the processor cores 201 can be reduced. Therefore, it is possible to make the degradations of the plurality of processor cores 201 uniform (i.e., balanced) and thereby to increase their overall life spans.

Sixth Embodiment

Figure 10:
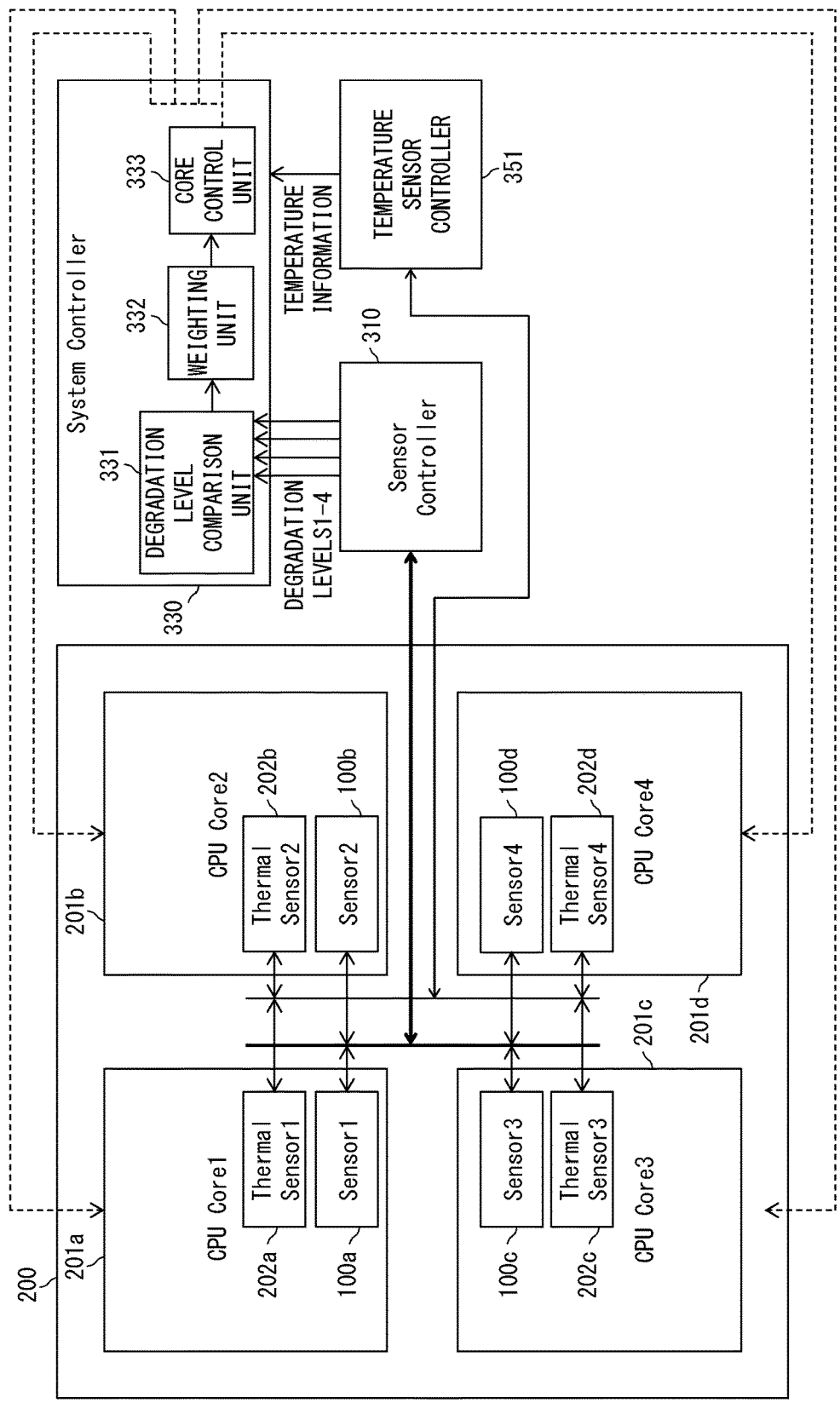
FIG. 10 shows a configuration of a processing system according to a sixth embodiment.

A processing system 200 according to this embodiment is explained with reference to FIG. 10. FIG. 10 shows a configuration of the processing system 200 according to the sixth embodiment. In this embodiment, combined control based on degradation levels and temperatures is performed. Therefore, the processing system 200 additionally includes temperature sensors 202a to 202d and a temperature sensor controller 351. Further, the system controller 330 is provided with a core control unit 333.

The temperature sensors 202a to 202d are provided so as to correspond to the processor cores 201a to 201d, respectively. That is, the temperature sensor 202a detects the environmental temperature of the processor core 201a. The temperature sensor 202b detects the environmental temperature of the processor core 201b. The temperature sensor 202c detects the environmental temperature of the processor core 201c. The temperature sensor 202d detects the environmental temperature of the processor core 201d. The temperature sensors 202a to 202d output the detected environmental temperatures to the temperature sensor controller 351.

The temperature sensor controller 351 outputs temperature information based on the four detected temperatures to the core control unit 333. An average value or the like of the four detected temperatures detected by the temperature sensors 202 can be used as the temperature information. Therefore, the temperature information has a value indicating the environmental temperature of the processor cores 201. The core control unit 333 determines the processor cores 201 to be used based on the temperature information. By doing so, the increase in temperature of the processor cores 201 can be prevented or reduced. Further, the weighting unit 332 outputs weights, which are determined based on the degradation levels, to the core control unit 333.

In general, an LSI has a predetermined upper-limit temperature below which the LSI can be used. Therefore, when the temperature gets close to the upper-limit temperature, the number of operating processor cores 201 is reduced. By doing so, the power consumption is reduced and hence the increase in temperature is prevented.

Figure 11:
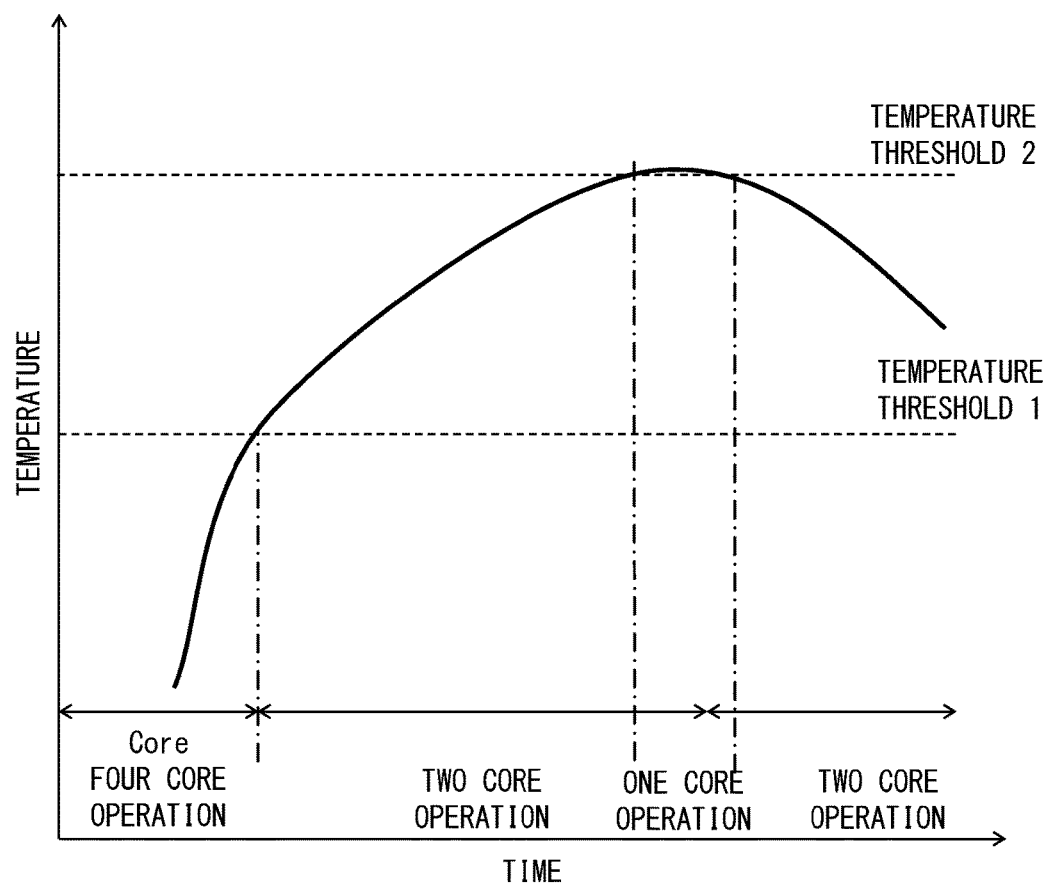
FIG. 11 schematically shows a process for changing the number of operating processor cores according to a temperature.

FIG. 11 is a graph schematically showing the number of operating processor cores 201 that is changed according to the temperature. In FIG. 11, the number of operating processor cores 201 is changed based on temperature thresholds 1 and 2. For example, when the detected temperature is lower than the temperature threshold 1, all of the four processor cores 201 are operated. When the detected temperature exceeds the temperature threshold 1, the number of operating processor cores 201 is reduced to two. Further, when the detected temperature exceeds the temperature threshold 2 higher than the temperature threshold 1, the number of operating processor cores 201 is reduced to one. Then, when the detected temperature decreases below the temperature threshold 1 or 2, the number of operating processor cores 201 may be increased.

Further, when the number of operating processor cores is changed, a processor core 201 having a low degradation level is stated to operate, rather than starting the operation of a processor core 201 having a high degradation level. That is, a processor core 201 having a low degradation level is preferentially stated to operate. When the number of operating processor cores is reduced, the core control unit 333 stops the operation of a processor core 201 having the highest degradation level among the operating processor cores 201. On the other hand, when the number of operating processor cores is increased, the core control unit 333 starts to operate a processor core 201 having the lowest degradation level among the suspended processor cores 201. In this way, the higher the degradation level of a processor core 201 is, the shorter the operating time of that processor core 201 becomes. In other words, the lower the degradation level of a processor core 201 is, the longer that processor core 201 operates. In this way, the variations among the aged-degradation levels of the processor cores 201 can be reduced.

In general, the speed of the aged-degradation of NBTI, PBTI, and the like increases as the voltage and/or the temperature increases. Therefore, when the number of operating processor cores is limited based on the temperature control, the processor cores 201 to be operated are determined according to the degradation levels. That is, they are preferentially started to operate in the ascending order of their degradation levels. In other words, in the temperature control in which the number of operating processor cores 201 is determined according to the environmental temperature, the system controller 330 preferentially stops the operation of a processor core 201 having a large degradation level. In this way, the degradation levels of the processor cores 201 become more uniform (i.e., become more balanced).

Seventh Embodiment

Figure 12:
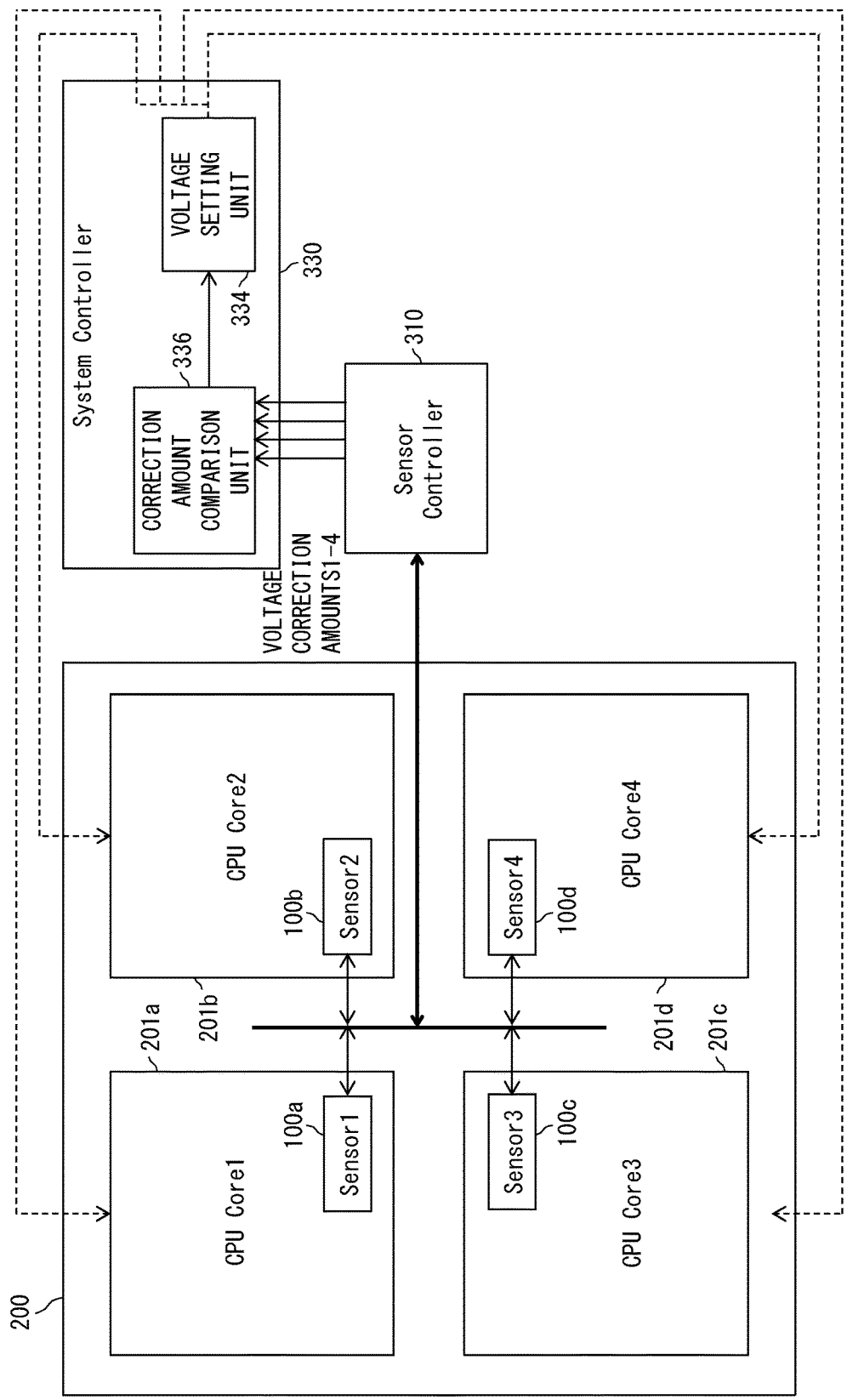
FIG. 12 shows a configuration of a processing system according to a seventh embodiment.

A processing system 200 according to this embodiment is explained with reference to FIG. 12. FIG. 12 shows a configuration of the processing system 200 according to the seventh embodiment. In this embodiment, by feeding back a voltage correction amount to the system control, an appropriate operating voltage is applied to each of the processor cores 201. When an individual voltage is supplied to each of the processor cores 201 by a regulator or the like disposed in the processor core 201, an individual voltage can be set for each of the processor cores 201.

Compared to the processing system 200 according to the fifth embodiment, a voltage setting unit 334 is provided instead of the weighting unit 332 in this embodiment. Further, the degradation level comparison unit 331 is replaced by a correction amount comparison unit 336. The sensor control unit 310 outputs a voltage correction amount to the system controller 330. That is, the correction amount output unit 315 shown in FIG. 8 outputs a voltage correction amount of each of the sensor circuits 100a to 100d to the system controller 330. Then, the correction amount comparison unit 336 compares the voltage correction amounts of the sensor circuits 100a to 100d. The result of the comparison in the correction amount comparison unit 336 is input to the voltage setting unit 334. Then, the voltage setting unit 334 sets the operating voltages of the processor cores 201a to 201d according to the comparison result.

Figure 13:
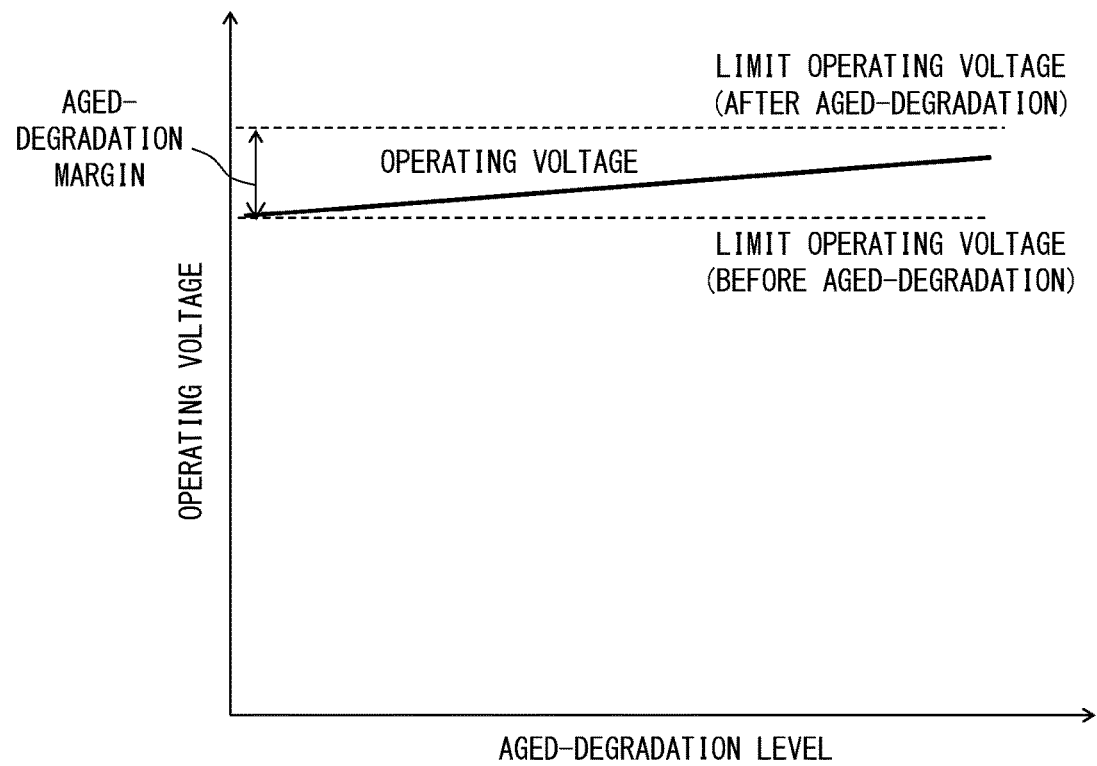
FIG. 13 is a graph for explaining a relation between the amount of aged-degradation and an operating voltage.

FIG. 13 shows a relation between aged-degradation levels and operating voltages. As shown in FIG. 13, the limit operating voltage of the processor core 201 changes between before and after its aged-degradation. After the aged-degradation, since the device characteristics are lowered, the processor core 201 does not operate properly unless the operating voltage is raised. Therefore, after the aged-degradation has advanced, the limit operating voltage increases. In general, in consideration of the aged-degradation, the voltage required after the aged-degradation is often set as the voltage applied to the processor core 201.

However, by using the configuration of this embodiment, it is possible to obtain a voltage correction amount according to the aged-degradation level. Then, the system controller 330 refers to the voltage correction amount, so that the operating voltage is increased as the degradation advances (FIG. 13). That is, the system controller 330 performs control so that a low operating voltage is used before the aged-degradation occurs and the operating voltage is increased as the aged-degradation advances. Since the operating voltage is lower than the conventional operating voltage before the aged-degradation occurs, the advancement of the aged-degradation is slow. Further, the consumed power can be reduced.

As described above, the system controller 330 individually sets the operating voltages of the processor cores 201a to 201d according to their degradation levels. Note that when the same power supply voltage is used for all the processor cores 201a to 201d, the worst voltage correction amount (i.e., the largest voltage correction amount) may be used for all the processor cores 201a to 201d. That is, the operating voltage of the plurality of processor cores 201a to 201d can be set based on the degradation level of the processor core 201 having the largest degradation level.

Note that it is also possible to adjust the operating frequency of the processor cores 201. For example, the larger the degradation level is, the more the operating frequency may be lowered.

At least two of the above-described first to seventh embodiments may be combined with each other as required. For example, arbitrarily-selected two or all of the operating voltage control according to the seventh embodiment, the weighting control according to the fifth embodiment, and the control for the number of operating processor cores according to the sixth embodiment may be combined with one another. By doing so, more suitable control can be performed. Therefore, it is possible to reduce the power consumption and increase the life span. Further, when an alarm is output for a processor core 201, that processor core 201 may be stopped.

Although a configuration for measuring a degradation level of a processor core is explained in the above explanation, a degradation level of a macro block other than the processor core may be measured. For example, it is possible to measure a degradation level of a macro block such as an encoder for performing encoding and a decoder for performing decoding. For such macro blocks, it is possible to assign tasks such as encoding tasks and decoding tasks in parallel according to the degradation levels.

The present invention made by the inventors has been explained above in a specific manner based on embodiments. However, the present invention is not limited to the above-described embodiments, and needless to say, various modifications can be made without departing from the spirit and scope of the present invention.

While the invention has been described in terms of several embodiments, those skilled in the art will recognize that the invention can be practiced with various modifications within the spirit and scope of the appended claims and the invention is not limited to the examples described above.

Further, the scope of the claims is not limited by the embodiments described above.

Furthermore, it is noted that, Applicant's intent is to encompass equivalents of all claim elements, even if amended later during prosecution.

What is claimed is:

1. A semiconductor apparatus comprising:
an operation oscillator;
a reference oscillator;
a first operation switch connected in series with the operation oscillator between a power supply potential and a ground potential;
a first reference switch connected in series with the reference oscillator between the power supply potential and the ground potential;
a second reference switch connected in parallel with the reference oscillator between the power supply potential and the ground potential;
an operation counter configured to count a number of first output pulses from the operation oscillator in a predetermined measurement period;
a reference counter configured to count a number of second output pulses from the reference oscillator in the predetermined measurement period;
a first gating component inputs the number of first output pulses; and
a second gating component inputs the number of second output pulses,
wherein the predetermined measurement period is set as a period during which the first gating component and the second gating component are in a through state.

2. The semiconductor apparatus according to claim 1, further comprising a second operation switch connected in parallel with the operation oscillator between the power supply potential and the ground potential.

3. The semiconductor apparatus according to claim 2, further comprising a switch control circuit configured to control the first reference switch, the first operation switch, the second reference switch, and the second operation switch, wherein
the switch control circuit turns off the first reference switch, turns on the first operation switch, turns on the second reference switch, and turns off the second operation switch in a normal operating state, and
the switch control circuit turns on the first reference switch, turns on the first operation switch, turns off the second reference switch, and turns off the second operation switch in a degradation level measurement state.

4. The semiconductor apparatus according to claim 2, wherein
the first reference switch and the first operation switch are PMOS transistors, and
the second reference switch and the second operation switch are NMOS transistors.

5. The semiconductor apparatus according to claim 2, wherein
the first reference switch and the first operation switch are NMOS transistors, and
the second reference switch and the second operation switch are PMOS transistors.

6. The semiconductor apparatus according to claim 2, further comprising:
an operation current source connected in series with the second operation switch; and
a reference current source connected in series with the second reference switch.

7. The semiconductor apparatus according to claim 1, further comprising a regulator connected to the power supply potential.

8. A degradation value determination system comprising:
a plurality of sensor circuits; and
a sensor control circuit configured to control the sensor circuit, wherein
each of the plurality of sensor circuits comprises a semiconductor apparatus according to claim 1, and
the sensor control circuit determines a degradation level of an object to be measured according to a result of a comparison between counter values of the operation counter and the reference counter.

9. The degradation value determination system according to claim 8, wherein the sensor control circuit corrects an operating voltage of the object to be measured according to the degradation level of the operation oscillator of the plurality of sensor circuits.

10. A processing system comprising:
a plurality of macro blocks; and
a plurality of sensor circuits provided so as to correspond to the plurality of macro blocks, wherein
each of the plurality of sensor circuits comprises a semiconductor apparatus according to claim 1, and
the sensor circuits are connected to power sources from which power is supplied to corresponding macro blocks.

11. The processing system according to claim 10, further comprising:
a sensor control unit configured to determine a degradation level of the operation oscillator according to a result of a comparison between counter values of the operation counter and the reference counter; and
a system controller configured to assign weights for assigning a task to the plurality of macro blocks.

12. The processing system according to claim 10, further comprising:
a temperature sensor configured to measure an environment temperature of the macro block;
a sensor control unit configured to determine a degradation level of the operation oscillator according to a result of a comparison between counter values of the operation counter and the reference counter; and
a system controller configured to determine a number of operating macro blocks according to the environment temperature, wherein
the system controller preferentially stops an operation of a macro block having a high degradation level.

13. The processing system according to claim 10, further comprising:
a sensor control unit configured to determine a degradation level of an object to be measured according to a result of a comparison between counter values of the operation counter and the reference counter; and
a system controller configured to individually set each of power supply voltages of the plurality of macro blocks according to degradation level.

14. The processing system according to claim 10, wherein the macro blocks are processor cores.

\* \* \* \* \*